United States Patent [19]

Kumar et al.

[11] Patent Number: 5,223,356
[45] Date of Patent: Jun. 29, 1993

[54] PHOTOCROSSLINKED SECOND ORDER NONLINEAR OPTICAL POLYMERS

[75] Inventors: Jayant Kumar, Lowell; Sukant K. Tripathy, Acton; Braja K. Mandal; Jan-Chan Huang, both of Lowell, all of Mass.

[73] Assignee: University of Lowell, Lowell, Mass.

[21] Appl. No.: 700,261

[22] Filed: May 15, 1991

Related U.S. Application Data

[63] Continuation-in-part of Ser. No. 573,253, Aug. 24, 1990, Pat. No. 5,112,881.

[51] Int. Cl.[5] .................. C08J 3/28; C08F 265/00; G03C 1/725
[52] U.S. Cl. ........................... 430/1; 430/2; 522/117
[58] Field of Search ................ 522/117; 430/1, 2

[56] References Cited

U.S. PATENT DOCUMENTS 4,615,962 10/1986 Garito .................... 430/18

FOREIGN PATENT DOCUMENTS 0321891 3/1988 European Pat. Off. .
0313475 5/1988 European Pat. Off. .
0313476 5/1988 European Pat. Off. .

OTHER PUBLICATIONS

M. Eich et al., *J. Appl. Phys.*, 66(7): 3241-3247 (1989).
B. Reck et al., *SPIE*, 1147: 74-83 (1989).
K. D. Singer et al., *Appl. Phys. Lett.*, 53: 1800-1802 (1988).
M. A. Mortazavi, et al., *J. Opt. Soc. Am. B*, 6(4): 733-741 (1989).

Primary Examiner—Marion E. McCamish
Assistant Examiner—Mark A. Chapman
Attorney, Agent, or Firm—Hamilton, Brook, Smith & Reynolds

[57] ABSTRACT

A novel photocrosslinkable polymeric system has been developed for processing into films having stable second-order nonlinear optical properties. In the present system, polymers bearing photo-crosslinkable chromophores, such as polyvinylcinnamate and are reacted with appropriately designed nonlinear optical molecules with the cinnamate or other photocrosslinkable functionalities for photocrosslinking at one, two or more points. The system can be poled and photocrosslinked in the poled state to yield a material with stable optical nonlinearity and large electro-optic coefficients.

4 Claims, 5 Drawing Sheets

PHOTOCROSSLINKED SECOND ORDER NONLINEAR OPTICAL POLYMERS

GOVERNMENT SUPPORT

This invention was made with Government support under Grant N00014-90-J-1148 awarded by the Office of Naval Research and Contract F19628-88-K-0048 awarded by the Department of the Air Force. The Government has certain rights in this invention.

RELATED APPLICATIONS

This application is a continuation in part of U.S. application Ser. No. 07/573,253 filed Aug. 24, 1990, U.S. Pat. No. 5,112,881.

BACKGROUND OF THE INVENTION

Second order nonlinear optical (NLO) polymers are expected to find extensive uses in opto-electronic applications. NLO polymers have several advantages over single crystalline inorganic and organic molecular systems. These include easy preparation, adjustable refractive indices and controlled arrangement of spatial order. For second order applications it is imperative that the material be noncentrosymmetric. In noncentrosymmetric organizations several organic molecular and polymeric systems have been characterized by large second order NLO coefficients, ultra-fast response times, performance over a broad wavelength range and high laser damage threshold compared to the traditional inorganic materials, e.g., lithium niobate ($LiNbO_3$) or potassium dihydrogenphosphate ($KH_2PO_4$). Background information relating to the principles of nonlinear optical polymers, is contained in "Nonlinear Optical and Electroactive Polymers", edited by Prasad and Ulrich, Plenum Press, (1988).

A number of applications, such as second harmonic generation (SHG), frequency mixing, electro-optic modulation, optical parametric emission, amplification and oscillation have been proposed for organic and polymeric materials with large second order NLO coefficients. R. D. Small et al., "Molecular and Polymeric Optoelectronic Materials: Fundamentals and Applications", edited by Khanarian, SPIE, 682:160 (1986). A number of approaches have been made in the past decade to organize NLO molecules in a polymer matrix in a noncentrosymmetric manner. The most important, but not the only aspect from the standpoint of application, is the organization of NLO molecules into preferred orientation and their stability in the aligned state up to at least cold wire bond temperatures (about 100° C.).

Historically, one of the first approaches to this alignment of NLO molecules in a polymeric system came with the concept of the "guest-host" system. Singer et al., Appl. Phys. Let., 49:248 (1986). The NLO molecules may be incorporated by a solution casting method with an amorphous polymer and the second order nonlinearity may be imparted by subsequent poling of the NLO molecules in the matrix using an external electric field, e.g., corona poling, parallel plate poling or integrated electrode poling. Advantages of this approach are ease of processing, tailorable refractive indices, control of spatial ordering of the polymer, and choice of a wide range of materials. However, the decay (both the initial and long term) of second order properties as confirmed through SHG from the matrix is unavoidable when the poling field is withdrawn from the matrix. Moreover, a high degree of loading of the NLO molecules in the polymer is not possible because of phase segregation of the matrix or blooming of NLO molecules in the matrix, both resulting in optical scattering.

In a second approach, known as "grafted" systems, a number of new features are routed just by linking NLO molecules covalently in the side chains of a suitable polymer backbone Meredith et al., Macromolecules, 15:1385 (1982). Despite the synthetic complexity of such a system, a large number of NLO molecules (a concentration 2 to 3 times greater than the guest-host system) can be coupled with the polymer side chains, yet the polymers are easily processable. Both the initial and long term decay in second harmonic (SH) properties are reduced to a great extent.

Recently, a three dimensional network consisting of NLO molecules, known as the "cross-linked" system, has been developed to overcome a number of problems associated with the guest-host or grafted systems Reck et al., SPIE, 1147:74 (1989) and Eich et al., J. Appl. Phys., 66(7):3241 (1989) In this system, multifunctional epoxy and amino compounds containing NLO components are simultaneously processed, poled and cross-linked to freeze-in the nonlinear effects permanently. Properties resulting from the cross-linked system are significantly small decay in SH properties over a long period of time and the ability for processing with large concentrations of NLO molecules. However, for developing an optimal epoxy based NLO material precise control of the molecular weight of the prepolymer is a stringent and necessary condition. In addition, poling and curing at elevated temperatures has to be carried out over a long period of time (about 20 hours) making processing of the materials significantly difficult.

SUMMARY OF THE INVENTION

The invention relates to a novel three-dimensional polymer matrix comprising noncentrosymmetrically aligned NLO molecules. The present polymers are prepared by photochemical reactions between photosensitive chromophores which have been functionalized into NLO molecules and the same or related chromophores appended into a host polymer acting as the matrix.

The functionalized NLO molecules are at least difunctional, and form crosslinks with the chromophores on the polymer to form the desired three-dimensional crosslinked network. In one embodiment, an extended p-conjugated diazo dye system substituted with donor-acceptor groups, and cinnamate groups, at either end are used as model NLO molecules and polyvinylcinnamate (PVCN) is used as the model host polymer for the demonstration of the present invention. The cinnamate groups attached to the NLO molecules and the pendant cinnamate groups on the PVCN polymer are photocrosslinked, for example, by exposure to ultra-violet (UV) radiation, thereby forming a three-dimensional crosslinked network.

The present polymers may be cast in bulk or as films. Thin films of the present polymers can be produced, for example, by spin-coating from a solution containing the NLO molecules and the host polymer in an organic solvent or mixture of organic solvents. A wide range of solvents or solvent mixtures can be used for spin-coating.

The cast film is then poled to introduce noncentrosymmetric organization of the NLO molecules in the polymer film. This can be accomplished by exposing the film to an electric field, for example, by corona poling. The poling temperature is usually close to the glass transition temperature ($T_g$) of the polymer. The process conditions are specific to the system and can be established using the appropriate routine protocol.

The NLO molecules are then permanently frozen-in into the preferred orientation by crosslinking. Crosslinking is performed photochemically, for example, by exposure to UV irradiation. Poling and crosslinking can be performed as independent steps, or simultaneously.

Noncentrosymmetric polymer films produced as described herein have several advantages. They are easy to prepare, exhibit ultra-fast response times, are stable at elevated temperatures, perform over a broad wavelength range and have a high laser damage threshold. Also the process of poling is independent of the crosslinking process and they can be superimposed in a desired manner.

DETAILED DESCRIPTION OF THE INVENTION

The present polymers are prepared by reacting photo-reactive chromophores which are attached to NLO molecules with the same or related chromophores which are attached to a polymer forming the matrix. The term "NLO molecules" as used herein means molecules possessing second order nonlinear optical properties.

The NLO molecules are generally organic molecules possessing donor-acceptor groups. Organic molecules which possess donor-acceptor groups attached to an aromatic ring, which improve charge transfer through p-electron delocalization, and which exhibit second order NLO properties, are particularly useful as NLO molecules. Organic molecules having these properties are shown schematically below as Formula 1, and a specific compound, p-nitroaniline, is shown where the donor group (D) is an amine group ($NH_2$) and the acceptor group (A) is a nitro group ($NO_2$)

(1)

The terms "donor" and "acceptor" as used herein refer to functional groups which either "donate" or "accept" p electrons, respectively. The nitro group ($NO_2$) is the preferred p-acceptor although other groups such as cyano (CN) are also used. As a p-donor, nitrogen in the form of an amine group ($NH_2$) is preferred, although donor groups attached through other atoms such as oxygen, can also be employed. For example, donor groups which are useful in the present NLO molecules include, in addition to amine ($NH_2$), N,N-dimethylamine ($N(CH_3)_2$), N,N-diethylamine ($N(C_2H_5)_2$), methoxy ($-OCH_3$) and ethoxy ($-OCH_2CH_3$). Useful acceptor groups, in addition to nitro ($NO_2$) and cyano (CN), include pyridinium salts and N-oxide.

The p moiety can be any system rich in p electrons, such as a bezene ring. A bezene ring having substituents, such as hydroxy groups, which do not interfere with or which enhance the donor and acceptor characteristics of the ring system can also be used.

In a preferred embodiment of the present invention, conjugated p-extended NLO molecules are used. Efficient second order properties are obtained using NLO molecules having an extended conjugated p-electron system with an asymmetric charge distribution provided by donor-acceptor groups at either end of the conjugated system. A conjugated p-extended NLO molecule is shown schematically below as Formula 2, (2)

wherein X and Y represent the linking atoms to the acceptor (A) and donor (D) groups, respectively. For example, diazo, stilbene, and azomethine are useful conjugated NLO molecules, wherein X and Y are the moieties shown in Table 1.

TABLE 1

| | X | | Y |
|---|---|---|---|
| DIAZO | N | | N |
| STILBENE | CH | | CH |
| AZOMETHINE | CH | or | N |
| | N | | CH |

A method for producing conjugated NLO molecules is described in detail in Example 1. Higher magnitudes of the nonlinear effects in appropriate molecular arrangements can be obtained by molecular engineering and synthetic tailoring.

Any NLO molecule to which photosensitive chromophores may be attached at one, two or more points can be used in the present process. The photosensitive chromophores are best attached through hy- droxyl groups present in the NLO molecule One of the easiest ways to attach photosensitive chromophores such as, cinnamate, to the NLO molecules is by esterification of hydroxyl groups by cinnamoyl chloride ($C_6H_5$—CH=CH—COCl).

By attaching stronger electron-donating and electron-withdrawing groups, and/or increasing the length of the p-electron system, the absorption band of the corresponding charge-transfer excitations is shifted towards longer wavelengths. There may be an associated increase in the nonlinear optical coefficients. Thus, the second order nonlinear response and placement of the transparent window for optical applications can be tailored by rearranging the groups in the aromatic rings of the NLO molecules. NLO molecules selected with appropriate linear and nonlinear optical properties can be incorporated into a stable noncentrosymmetric organization.

The distribution of donor-acceptor groups and hydroxyl groups in the NLO molecules has a strong effect on the second order properties of the final polymeric system. The NLO molecules are functionalized by attaching photosensitive chromophores to the molecule, so that they can be photocrosslinked. In one embodiment, NLO molecules having diazo-linked p-extended systems were synthesized by a diazo coupling reaction of aromatic molecules substituted with donor-acceptor groups and hydroxyl groups. Nitro groups and N,N-diethylamine groups were chosen as the donor and acceptor groups, respectively, and were placed at either end of the p-extended molecule in order to obtain large second order electro-optic effects. The combination is shown in two isomeric structures as Formulae 3 and 4 below wherein R is H. The hydroxyl groups were each attached with a photosensitive chromophore, in this example a cinnamoyl group, to create a functionalized NLO molecule, shown as Formulae 3a and 4a below, wherein R is the cinnamoyl group, $C_6H_5$—CH=CH—CO.

(3) R = H
(3a) R = —CO—CH=CH—$C_6H_5$ (4) R = H
(4a) R = —CO—CH=CH—$C_6H_5$

In addition to cinnamate, a wide range of photosensitive chromophores are available for making photocrosslinkable functionalized NLO molecules which are useful in the present system, such as styrylacrylate ($C_6H_5$—CH=CH—CH=CH—$CO_2$—) or chalconeacrylate ($C_6H_5$—CO—CH=CH—$C_6H_4$—CH=CH—$CO_2$—). Photosensitive chromophores which are useful in photo-crosslinking reactions are described, for example, by Reiser in: *Photoreactive Polymers*, Wiley & Sons, Inc., New York (1989).

In the present photocrosslinking system, a three-dimensional polymer is produced by a photocrosslinking reaction between the photosensitive functional groups attached to the NLO molecules described above and the same or similar molecules on host polymers. Thus, the structure of the present polymer will depend upon the choice of the functionalized NLO molecule and the host polymer. The term "host polymer" as used herein refers to a polymer having photoreactive groups which are capable of photocrosslinking among themselves or with the photosensitive functional groups on the NLO molecule. Therefore, the choice of host polymer will depend, among other things, upon the functional groups attached to the NLO molecules. For example, if an NLO molecule contains a cinnamate functional group, then the host polymer will be selected to have the same or similar pendant groups which are capable of photocrosslinking with the cinnamate groups, such as polyvinylcinnamate (PVCN). Any polymer having photoreactive C=C moieties can act as a host system. For improved photoreactivity, the double bond should have adequate polarization and light-absorbing characteristics. For example, in PVCN, the adjacent carbonyl group provides a desirable polarization towards the reactivity of the double bonds. The phenyl group in PVCN, on the other hand, increases the polarizability and enhances the light absorbing power of the chromaphore. Polymers which are useful as host polymers include, in addition to PVCN, polymers containing styrylacrylate ($C_6H_5$—CH=CH—CH=CH—$CO_2$—) or chalconeacrylate ($C_6H_5$CO—CH=CH—$C_6H_4$—CH=CH—$CO_2$—) groups.

Figure 1:
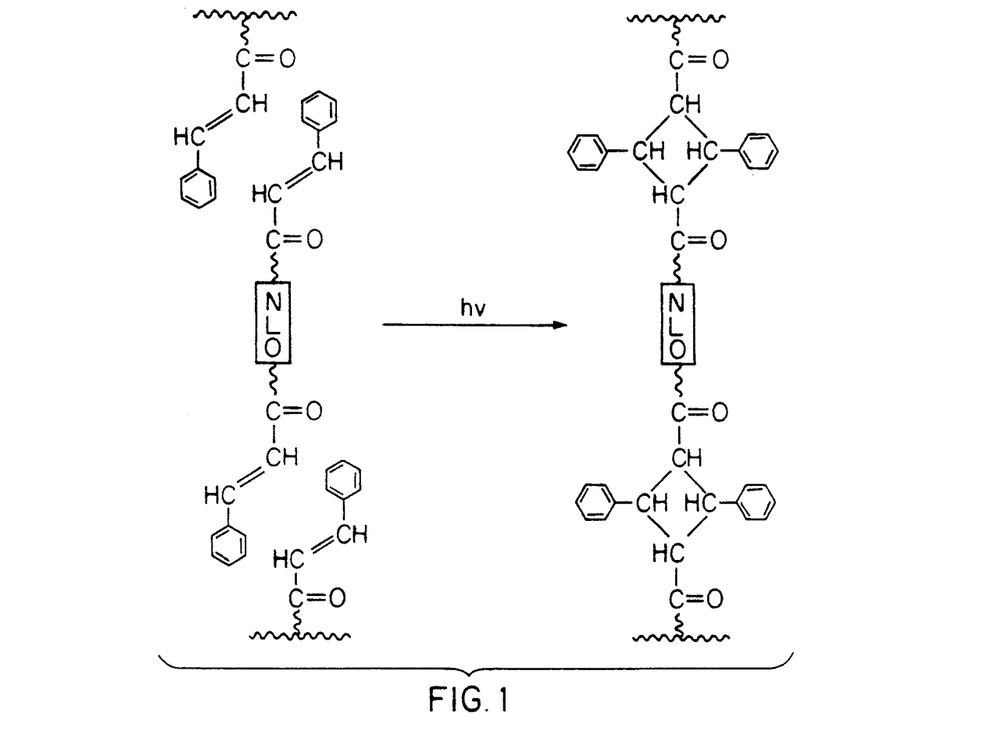
FIG. 1 is a schematic illustration of the photocrosslinking reaction between a cinnamate-functionalized conjugated NLO molecule and polyvinylcinnamate.

The reaction between a cinnamate-functionalized conjugated NLO molecule and PVCN as the host polymer is used as a model system to illustrate the present invention. In this reaction, crosslinks are formed by 2+2 photodimerization between an excited cinnamoyl group of the host polymer and the ground state cinnamoyl group belonging to the NLO molecule, or vice versa. The photodimerization between the two C=C double bonds of the cinnamoyl groups is very effective because of the adjacent carbonyl group which provides desirable polarization towards the reactivity of the double bond. The phenyl group, on the other hand, increases the polarizability and enhances the light absorbing power of the chromophore. The intermolecular photocrosslinking reaction between the photosensitive chromophores of the polymer and the active NLO molecules is represented schematically in FIG. 1.

Improvement of the relative photosensitivity and spectral sensitivity range in the host polymer beyond those of PVCN is possible by introducing a second double bond into the conjugated olefin-ketone system of the cinnamoyl group, as shown, for example, in Formula 5 below. Certain pyridinium salts, shown as Formula 6, are also known to activate double bonds towards photocrosslinking reactions. The spectral sensitivity range can be controlled by selection of the appropriate R group. For example, in Formula 6, R can be $NO_2$ or $OCH_3$.

In the model system used to illustrate the present invention, the NLO molecules are functionalized with cinnamate groups to allow intermolecular photocrosslinking reactions to occur with PVCN. The cinnamoyl group absorbs its maximum at about 280 nanometers (nm), but the crosslink generating photoreaction can be performed albeit, at a slower rate at a wavelength of 254 nm as well. The photocrosslinking reaction can be enhanced, for example, by spectral sensitization by the replacement of the cinnamate group with a chromophore that absorbs at maximum at a longer wavelength, such as styrylacrylate, or by adding a sensitizing agent.

There are a large number of compounds that sensitize PVCN in the near-ultraviolet region and significantly increase the photosensitivity of the composition. For example, thiazolines (N-methylbenzoyl-b-naphthathiazoline), nitroaromatics (3-nitroacenaphthalene) and ketocoumarins (7-propoxy-3-benzoylcoumarin) represent three major efficient classes of sensitizers among others. They absorb at longer wavelengths and funnel this energy to a reactive site.

An alternative sensitization approach involves the modification of the photosensitive chromophore attached to the host polymer. Traditionally, cinnamate polymers have been prepared by the esterification of polyvinylalcohol, for example, by Delzenne in: *Encyclopedia of Polymer Science and Technology*, Suppl. Vol. 1, pp. 401 J. Wiley & Sons, Inc., New York (1976). Copolymers of PVCN can be prepared for use as host polymers to address particular fabrication requirements. The photocross-linkable units can be made to function at 200 to 700 nm as a result of the judicious use of specific chromophores with specific triplet sensitization. One example of a photocrosslinkable polymer is polyvinyl styrylacrylate (shown as above as Formula 5). This polymer absorbs at longer wavelengths (330 nm) and has a lower triplet energy than cinnamate. Hence, the choice of the photocrosslinkable polymer/ sensitizer combination permits tailoring of the system to respond to specific light sources and wavelengths.

The present three-dimensional polymers are prepared by the following general procedure. The polymers can be cast in bulk or as films. A conventional spinning technique is employed for illustrative purposes in the present procedure. In this process, thin films of the functionalized NLO molecules and the photosensitive host polymers are coated over substrates such as glass, quartz or thermally grown silicon dioxide on silicon. In this method, the functionalized NLO molecules and the host polymer are dissolved in an organic solvent or solvent mixture. The solution can contain broad ratios of the NLO molecule and the host polymer depending on the properties of the polymer which are desired. The amounts of each can be determined by routine methods. A broad range of solvents may also be used. The choice of solvent will depend upon the solubility of the NLO molecules and host polymers. Polar organic solvents are useful in this process. For PVCN, tetrahydrofuran (THF), 1,4-dioxane, furfural and a toluene:1-chlorobenzene mixture (1:3), can be used for obtaining good quality thin films.

Thin films of the polymers can be produced by spin-coating the solution. Films having a thickness of from about 0.5 lm to about 2.5 lm may be easily obtained. Film thickness can be controlled by adjusting the spinning speed and/or the viscosity of the solution.

In another embodiment of the present method, the NLO molecules are attached to the host polymer, and a solution of the NLO-functionalized polymer is spin-coated onto a substrate as described above. The polymer has pendant photoreactive chromophores, and crosslinking takes place between the photoreactive chromophores.

The cast films are allowed to dry, and are then "poled" to introduce noncentrosymmetic organization to the NLO molecules in the film. This can be accomplished, for example by corona poling. Poling can be carried out as described in "Electrets", Sessler (Ed.) Springer-Verland, Berlin, Germany, pp. 3 (1987). This poling temperature is usually close to the glass transition temperature ($T_g$) of the polymer. In the present PVCN system the poling temperature was chosen close to 70° C., which is about 10° C. below the Tg of the polymer. The applied voltage on the corona wire is varied depending on the thickness of the film, concentration of NLO molecules and the temperature selected for poling. The corona current is generally in the range of from about 1.5 to about 3.5 1A.

The effective poled area, approximately 1.5 cm wide and 2.5 cm long, appears more transparent compared to the unpoled region as the chromophores are aligned normal to the film as a result of poling. The exact process conditions will be specific to the system and can be determined by routine experimentation.

The NLO molecules are then permanently frozen-in into the preferred orientation by crosslinking. Crosslinking is performed photochemically, for example, by UV irradiation. The wavelength of irradiation can be selected depending on the absorption profile of the polymer matrix. In general, almost all films in which PVCN is the host polymer can be photocrosslinked at a wavelength of 254 nm. The crosslinking reaction can be carried out over a wide frequency range of the incident light, for example, light sources rich in the 365 nm line of mercury can be used. Or, an argon-ion laser can be used, with a small quantity of a commercially available triplet sensitizer, such as 7-propoxy-3-benzoylcoumarin. Photocrosslinking can be performed at the late stage of the poling cycle while the electric field is on, or immediately after the poling field is removed.

The refractive index of the film can be measured by ellipsommetry. The index varies as a function of the concentration of NLO molecules in the matrix. Typically, a film of 1.5 lm thickness containing 20% by weight NLO molecules has a refractive index of 1.58 for the poled regions and 1.63 for the unpoled regions in the plane of the film at a wavelength of 532 nm.

The nonlinear optical properties of the poled films can be investigated by using SHG as the probing technique. In this method, measurements are made on a Q-switched Nd-YAG laser in which a polarized beam of light is passed through the sample, and the second-harmonic coefficient of the crosslinked polymer film, $d_{33}$, is obtained. Polymer matrices made by the present method show no decay in SHG over long periods of time at elevated temperatures, for example, ranging from about 60° to 85° C.

In the model system, for example, a Q-switched Nd:YAG laser (k=1064 nm) with a pulse width of 10 nanoseconds (ns) and a pulse energy of 45 millijoules (mJ) was used as the fundamental source, and a reference sample of Y-cut quartz ($d_{11}=0.364$ pm/V) was used for the calibration of the frequency doubled signal. The second harmonic coefficient of the polymer film, $d_{33}$, of the model system, was obtained from a Maker fringe analysis of the data. Jeophagnon et al., *J. App. Phys.*, 41:1667 (1970). The value of $d_{33}$ varied from 15 to 30 picometers/volt (pm/V) depending on the concentration of NLO molecules. By optimizing the degree of alignment and the concentration of the NLO molecules in the polymer matrix, the second order coefficient can be further varied.

The three-dimensional, nonlinear optical polymers of the present invention have large second order NLO properties. The present polymers exhibit many desirable processing characteristics, such as excellent negative resist and poling and doping features. The present polymers are poled, and photocrosslinked in the poled state to yield a material having excellent optical quality, stable optical nonlinearity and large electro-optic coefficients.

The present NLO polymers can be used in a number of applications, such as second harmonic generation (SHG), frequency mixing, electro-optic modulation, optical parametric emission, amplification and oscillation. The use of polymeric materials having large second order NLO co-efficients, such as the present polymers, is described by R. D. Small et al., in: "Molecular and Polymeric Optoelectronic Materials: Fundamentals and Applications", edited by Khanarian, *SPIE*, 682:160 (1986).

In another embodiment of the invention, NLO polymer patterning can be accomplished by a contact printing method or a holographic imaging technique. Large index of refraction changes can be realized during the photo-crosslinking to form NLO polymers. These NLO polymers can be used to pattern optical devices such as channel wave guides and active devices for fabrication of, for example, switches and modulators.

Figure 4:
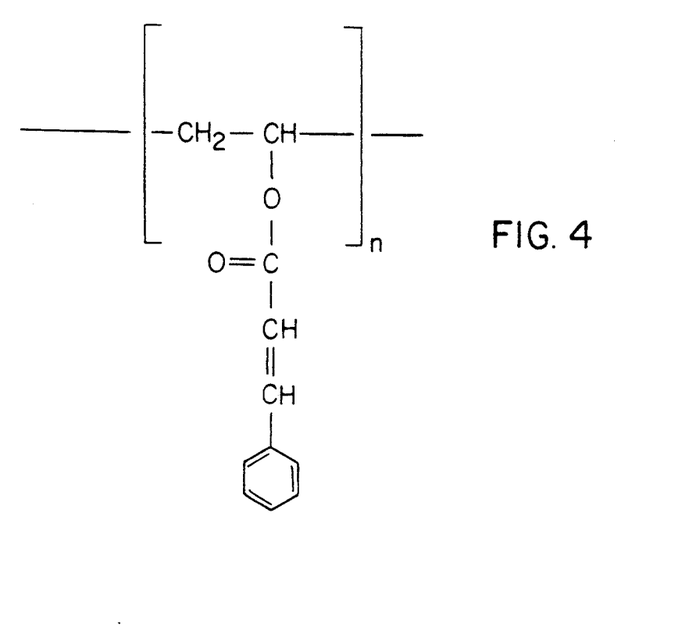
FIG. 4 is a diagram of the structure of polyvinylcinnamate (PVCN).

For example, patterning by contact printing includes disposing a patterned photomask on a film. The film includes a nonlinear optical molecule, containing a first photosensitive chromophore, and a host polymer, containing a second photosensitive chromophore capable of crosslinking with the first photosensitive chromophore. In one embodiment, the nonlinear optical molecule, containing the first photosensitive chromophore, is Disperse Red-2 (DR2), also known as 6-cinnamoyloxy-3-[4-(N,N-diethylamino) -2-cinnamoyloxyphenylazo] nitrobenzene, shown as Formula 4a, above. The first photosensitive chromophore in this embodiment is a cimmamoyl group. The host polymer, containing the second photosensitive chromophore capable of crosslinking with the first photosensitive chromophore, is polyvinylcinnamate (PVCN), shown in FIG. 4.

A suitable pattern of openings is cut in the photomask. The slits allow a laser beam to pass through the photomask and expose the underlying film. In one embodiment, the photomask material is chrome. The slits can have a width, for example, in the range of between about 1 and about 10 microns. Alternatively, the photomask can be a transparent substrate with a suitable pattern of lines or other suitable design which is formed of a material which is opaque to laser light. In one embodiment, the transparent substrate is made of glass and the opaque material is made of chrome.

The pattern of the photomask is formed in the film by directing a suitable laser beam through the photomask onto the film. This causes the nonlinear optical molecule, containing the first photosensitive chromophore, to react with the host polymer, which contains the second photosensitive chromophore capable of crosslinking with the first photosensitive chromophore. The index of refraction of the exposed film is changed by the photochemical reaction. The change of the index of refraction of the portions of the exposed film is sufficient to allow light to be channelled through those portions without being diffused into the remaining portions of the film.

Typically, the thickness of the film and index of refraction vary over the period of exposure to the laser beam. For many integrated optics applications, such as wave guiding, only the optical path length needs to be measured to determine the amount of crosslinking between the NLO molecules and the host polymer. The change of optical path length can be determined by a suitable method, such as ellipsometry. Also, the index of refraction can be obtained as the quotient of the optical path length and the film thickness.

Figure 5:
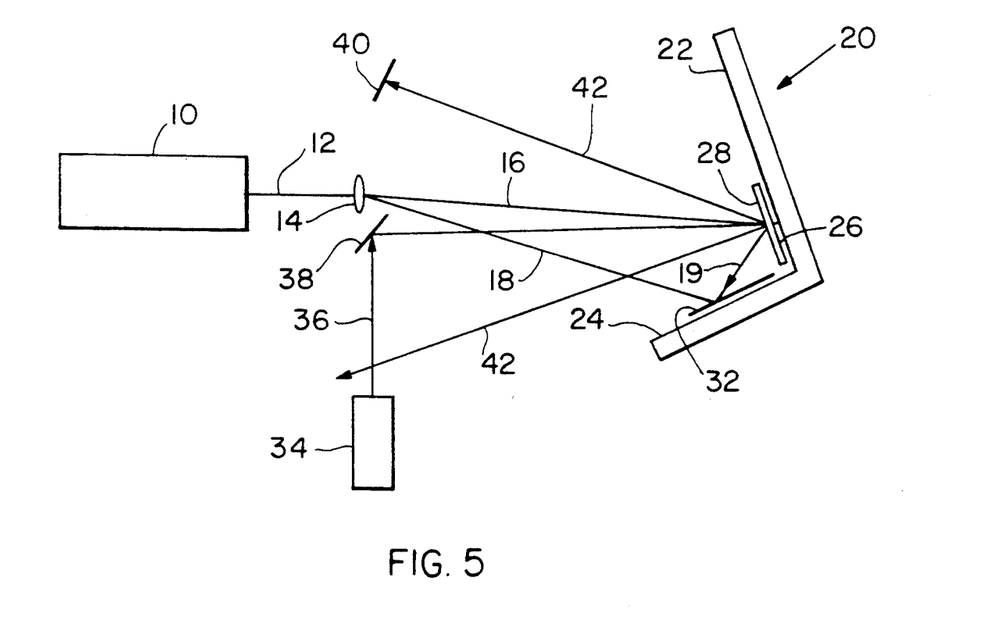
FIG. 5 is a schematic representation of a system for making a hologram.

In another embodiment, a holographic grating technique can be used to form holograms in the NLO polymer. These 3-D holograms that can be used as optical devices are formed by crosslinking in the NLO guest-host polymer. An example of a suitable apparatus for holographic imaging is shown in FIG. 5. Laser beam generator 10 generates frequency tripled Nd-YAG (Neodymium - Yttrium, Aluminum, and Garnet) laser beam 12. An example of a suitable laser beam generator is a Model 660A-20 laser beam generator, commercially available from Quantel, which generates a 256 nm wavelength laser beam. Laser beam 12 is split with lens 14 to form direct beam 16 and incident beam 18. An example of a suitable lens is a 12.5 mm focal length negative lens.

Bracket 20 is within the field of direct beam 16 and incident beam 18. Bracket 20 has sample side 22 and mirror side 24. Bracket 20 is suitable for supporting substrate 26. Film 28, including a suitable NLO molecule and a suitable host polymer, is disposed on substrate 26. Bracket 20 includes sample side 22 and mirror side 24. Mirror 32 is supported by mirror side 24. Incident beam 18 reflects off mirror 32 to form intersecting beam 19. Mirror side 24 is at an angle to sample side 22 which is suitable for causing intersecting beam 19 to intersect direct beam 16 at film 28. Sample side 22 and mirror side 24 can be suitably adjusted to change the angle at which incident beam 18 is reflected off mirror 32 to form intersecting beam 19.

Direct beam 16 and intersecting beam 19 intersect at film 28. Film 28 is irradiated with direct beam 16 and intersecting beam 19 to form a light intensity grating. The light intensity grating is transferred onto film 28 as a holographic image. The holographic image formed is a NLO polymer formed by the nonlinear optical molecule, containing a first photosensitive chromophore, which is photocrosslinked to the host polymer, containing a second photosensitive chromophore contained in the host polymer. The photocrosslinking and the formation of the NLO polymer hologram is caused by the combined intensity of direct beam 16 and intersecting beam 19 as the two beams intersect and interfere at film 28.

The diffraction efficiency of the resulting holographic grating can be monitored by a suitable device. In one embodiment, the diffraction efficiency of the holographic grating formed is monitored by probe beam generator 34, which generates probe laser beam 36 having a single wavelength. Probe beam generator 34 is suitably positioned to allow probe beam 36, to reflect off probe mirror 38 and onto film 28. Laser beam 36 is thereby reflected by probe mirror 38 to film 28 to form diffracted beam 42. Diffracted beam 42 is absorbed by phase-lock detector 40 to thereby continuously monitor the holographic grating diffraction efficiency.

The invention will now be illustrated by the following examples.

EXAMPLES

Example 1

Figure 2A:
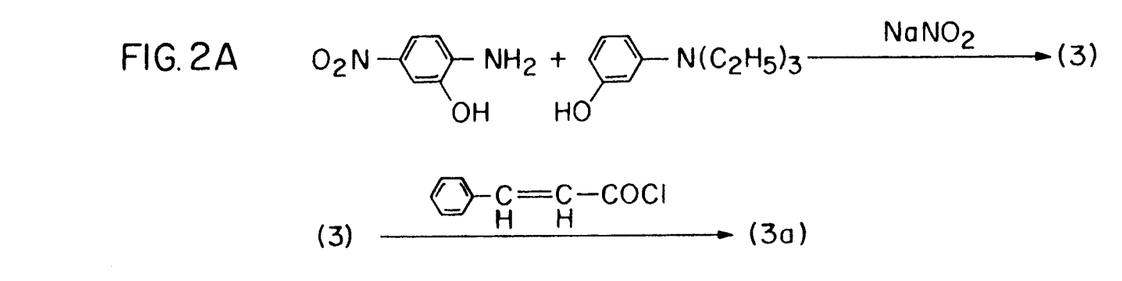
FIG. 2 is a schematic illustration showing the process for synthesizing cinnamate-functionalized NLO molecules. Scheme A illustrates the synthesis of 3-cinnamoyloxy-4-[4-(N,N-diethylamino)-2-cinnamoyloxyphenylazo]nitrobenzene and Scheme B illustrates the synthesis of 6-cinnamoyloxy-3-[4-(N,N-diethylamino)-2-cinnamoyloxyphenylazo]nitrobenzene.

The synthetic route for obtaining photosensitive chromophore-substituted diazo dyes is shown schematically in FIG. 2. The following reaction is shown in FIG. 2A. In this reaction, 18.63 g of 2-amino-5-nitrophenol was dissolved in 75 ml of concentrated sulfuric acid and 75 ml of water. 8.34 g of sodium nitrite dissolved in 100 ml of water was slowly added at temperatures below 5° C. To the cooled solution, 115 ml of 2N sodium hydroxide solution with 19.98 g of 3-diethylaminophenol was added and the reaction mixture was stirred overnight at room temperature. The product, 3-hydroxy-4-[4-(N,N-diethylamino)-2-hydroxyphenylazo]nitrobenzene, shown above as Formula 3 (wherein R=H), was filtered, washed with water and dried under vacuum at 60° C. The dye was purified by crystallization from chloroform.

Cinnamoyl chloride (3.15 g) in 10 ml THF was added dropwise to a solution of 1 (3.12 g) and triethylamine (3 g) in THF (10 ml) and stirred for 12 h at room temperature. The solvent was removed under reduced pressure, the residue was dissolved in dichloromethane, washed with water and dried over magnesium sulfate ($MgSO_4$). The product, 3-cinnamoyloxy-4-[4-(N,N-diethylamino)-2-cinnamoyloxyphenylazo]nitrobenzene, shown above as Formula 3a, was purified by column chromatography (silica gel, THF as eluent) as a deep red solid.

1g of PVCN and 0.2 g of 1a were dissolved in 5 ml of 1,4-dioxane using an ultrasonic mixer at 35° C. The resulting solution was used to spin-coat a glass substrate at 1250 to 4000 rpm for 1 min. Prebaking of the sample was done immediately after spin-coating at 60° C. for 12 hours.

The substrate was kept on the hot-stage of the poling equipment for 1 minute at 60° C. prior to the poling, and photocrosslinking cycles. The film was corona poled for 3 min. The applied voltage on the corona wire was maintained at 6 kV while the corona current of approximately 2 1A was established. The poled film was then cross-linked for 10 minutes by UV irradiation. A radiation dosage of 2.5 to 3 $mW/cm^2$ at wavelength 254 mn was maintained during the crosslinking reaction Sudden cooling of the substrate was done after UV irradiation by passing cold water through the hot-stage. The poling field was kept on during both the radiation and cooling cycles.

Figure 3:
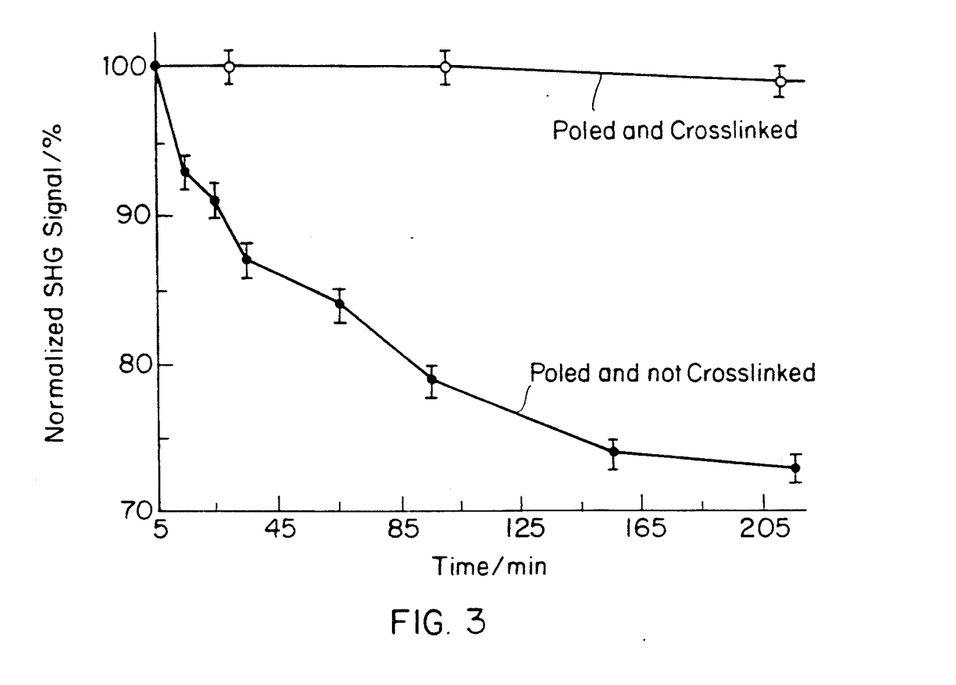
FIG. 3 is a graph illustrating the stability of a poled PVCN film crosslinked with 3-cinnamoyloxy-4-[4-(N,N-diethylamino)-2-cinnamoyloxyphenylazo]nitrobenzene compared to a poled and noncrosslinked PVCN film with the same compound.

The results are shown in Table 2 below, and in FIG. 3. As shown in FIG. 3, the poled PVCN film crosslinked with compound 3a is much more stable than a poled, uncrosslinked PVCN film.

TABLE 2

| Optical properties of PVCN film doped with 3a | | |
|---|---|---|
| | PVCN/3a (10%) | PVCN/3a (20%) |
| Thickness (μm) | 0.5 | 0.5 |
| Abs. max (nm) | 520 | 520 |
| $T_g$ (°C.)$^a$ | 84 | 81 |
| Refractive index | | |
| λ (μm) | | |
| 0.532 | 1.632 | 1.634 |
| 0.632 | 1.677 | 1.685 |
| 1.000 | 1.613 | 1.625 |
| $d_{33}$ (pm/V)$^b$ | 11 | 16.5 |

$^a$Obtained from DSC (DuPont 2910 differential scanning calorimeter), 10° C./min (midpoint). $T_g$ of PVCN is 88° C.
$^b$$d_{33}$ not corrected for absorption.

Example 2

Figure 2B:
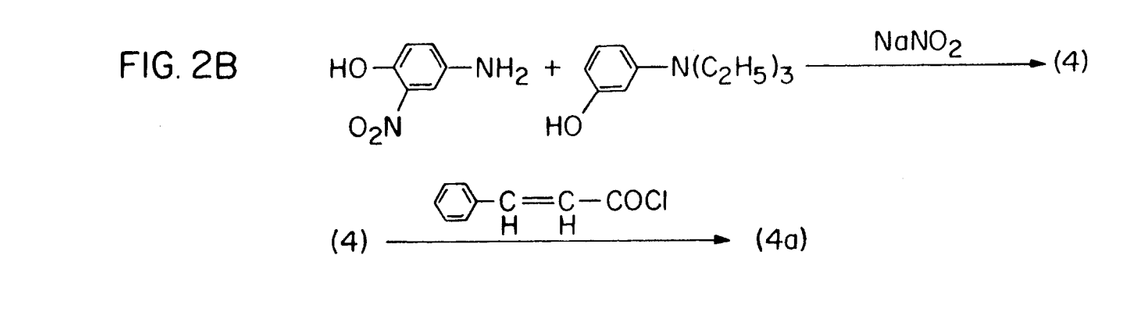

The following reaction is shown schematically in FIG. 2B. In this reaction, 15.41 g of 4-amino-2-nitrophenol was dissolved in 60 ml of concentrated sulfuric acid and 60 ml of water. 6.9 g of sodium nitrite dissolved in 100 ml of water was slowly added at temperatures below 5° C. To the cooled solution, 100 ml of 2N sodium hydroxide solution with 16.52 g of 3-diethylaminophenol was added and the reaction mixture was stirred overnight at room temperature. The product, 6-hydroxy-3-[4-(N,N-diethylamino)-2-hydroxyphenylazo]nitrobenzene, shown as Formula 4 above (wherein R=H), was filtered, washed with water and dried under vacuum at 60° C. The dye was used purified by column chromatography over silica gel (using dichloromethane/diethylether[1:1] as eluent) as a pink crystal.

Cinnamoyl chloride (1.02 g) in 5 ml THF was added dropwise to a solution of dye 2 (1 g) and triethylamine (0.77 g) in THF (10 ml) and stirred for 12 h at room temperature. The solvent was removed under reduced pressure, the residue was dissolved in dichloromethane, washed with water and dried (MgSO$_4$). The product, 6-cinnamoyloxy-3-[4-(N,N-diethylamino)-2-cinnamoyloxyphenylazo]nitrobenzene, shown as Formula 4a above, was purified by column chromatography (silica gel, THF as eluent) as an orange solid.

1 g of PVCN and 0.2g of 4a were dissolved in 5 ml of 1,4-dioxane using an ultrasonic mixer at 35° C. The resulting solution was used to spin-coat a glass substrate at 1250 to 4000 rpm for 1 min. Prebaking of the sample was done immediately after spin-coating at 60° C. for 12 hours.

The substrate was kept on the hot-stage of the poling equipment for 1 minute at 60° C. prior to poling and photocross-linking cycles which were 3 min and 10 min, respectively, as described in Example 1. The applied voltage on the corona wire was maintained at 6 kV while the corona current of approximately 2 1A was established. A radiation dosage of 2.5 to 3 mW/cm$^2$ at wavelength 254 nm was maintained during the cross-linking reaction Sudden cooling of the substrate was done after UV irradiation by passing cold water through the hot-stage. The poling field was kept on, during both the radiation and cooling cycles. The cross-linked polymer film was much more stable than a non-crosslinked sample of the film.

Example 3

A spin-coated film was formed on a glass substrate by the method described in Example 2. A pattern of parallel slits was defined in a chrome photomask to form a series of narrow lines having a width in the range between about 2.5 and about 30 microns in width. The photomask was disposed onto the spin-coated film. A comparative film was formed by the same method as described in Example 2, but without including DR2. A photomask was also placed on the comparative film.

The photomask pattern was formed in the two films by directing a 256 nm Nd-YAG generated laser beam through the photomasks onto the films. This caused the films to photocrosslink and form polymers which changed the optical path length of the exposed portions of the films.

Figure 6:
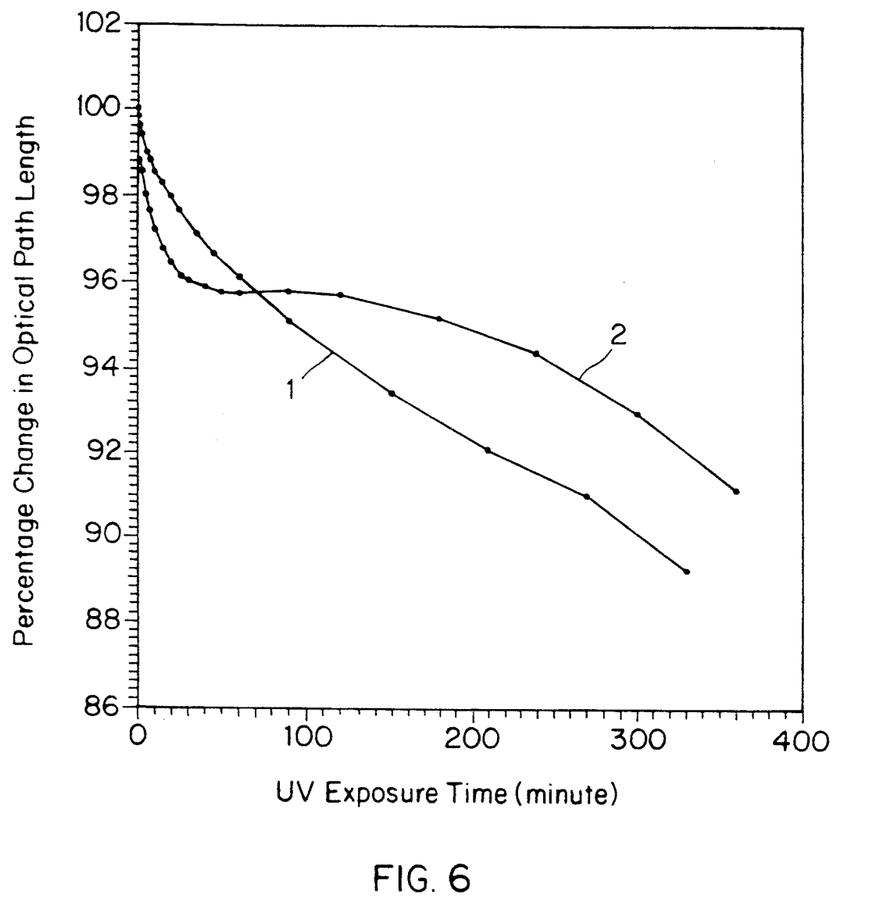
FIG. 6 is a plot of the percentage change of the optical path length for PVCN with DR2 for varying times of exposure.

The exposed films has a change in the optical path length. As shown in FIG. 6, the change in the optical path length, expressed as a percentage, was greater in the film which includes PVCN and twenty percent DR2, shown as curve 1, than in the film including PVCN, but without DR2, shown as curve 2, when the exposure time was greater than about eighty minutes.

Example 4

Two spin-coated films were formed on a glass substrate by the method described in Example 2, except that the twenty percent DR2 was substituted with one percent and five percent Coumarin #2, respectively, and the films were not electrically poled. A comparative film was formed by the same method as described in Example 2, but without including DR2 or Coumarin #2. A hologram was formed in the spin-coated films by the apparatus, as shown in FIG. 5, using a holographic grating technique. The laser beam generator generated a frequency-tripled Nd-YAG laser beam at 364 nm.

A direct beam was intersected by an intersecting beam reflected onto the film. The film was therefore irradiated with an intensity grating formed from the direct beam and the interfering beam. The light intensity grating was transferred onto film 28 as a holographic grating.

Figure 7:
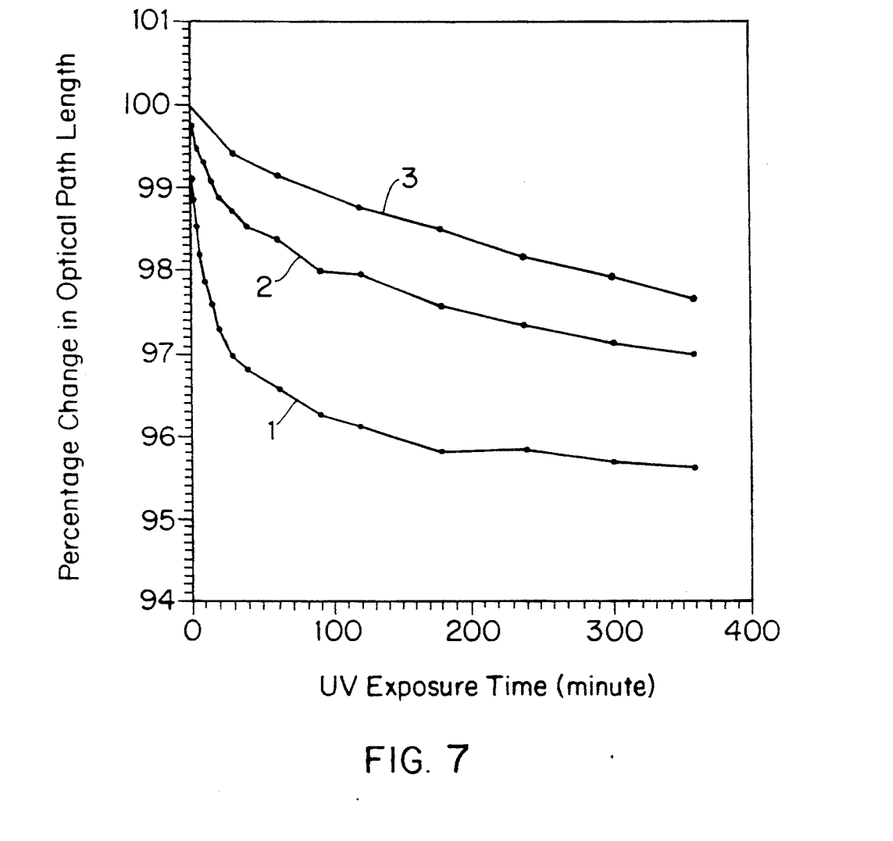
FIG. 7 is a plot of the percentage change of the optical path length for PVCN with Coumarin #2 for varying times of exposure.

Exposure of the film caused a change in the optical path length. As shown in FIG. 7, this change, expressed as a percentage, was greatest with the film which included PVCN and five percent Coumarin #2 shown as curve 1, than by using a film including PVCN with one percent Coumarin #2, shown as curve 2, or PVCN without Coumarin #2, shown as curve 3, during the exposure time.

Equivalents

Those skilled in the art will recognize, or be able to ascertain using no more than routine experimentation, many equivalents to the specific embodiments of the invention described herein. Such are intended to be encompassed by the following claims.

We claim:

1. A method of forming a hologram, comprising the steps of:
    a) forming a solution if (i) a guest nonlinear optical molecule containing a first photosensitive chromophore, (ii) a host polymer containing a second photosensitive chromophore capable of crosslinking with the first photosensitive chromophore and (iii) at least one organic solvent;
    b) casting the solution formed in (a) thereby forming an amorphous film;
    c) drying the amorphous film formed in (b); and
    d) exposing the amorphous film to a split interfering laser beam having a wavelength appropriate to cause crosslinking of the first and second photosensitive chromophores at select portions of the amorphous film to form a hologram.

2. A hologram formed by a method, comprising the steps of:
    a) forming a solution of (i) a guest nonlinear optical molecule containing a first photosensitive chromophore, (ii) a host polymer containing a second photosensitive chromophore capable of crosslinking with the first photosensitive chromophore and (iii) at least one organic solvent;
    b) casting the solution formed in (a) thereby forming an amorphous film;
    c) drying the amorphous film forming in (b); and
    d) exposing the amorphous film to a split interfering laser beam having a wavelength appropriate to cause crosslinking of the first and second photosensitive chromophores at select portions of the amorphous film to form a hologram.

3. A waveguide formed by a method, comprising the steps of:
    a) forming a solution of (i) a guest nonlinear optical molecule containing a first photosensitive chromophore, (ii) a host polymer containing a second photosensitive chromophore capable of crosslinking with the first photosensitive chromophore and (iii) at least one organic solvent;
    b) casting the solution formed in (a) thereby forming an amorphous film;

c) drying the amorphous film formed in (b); and
d) exposing the amorphous film to a laser beam pattern passing through a photomask defining the waveguide having a wavelength appropriate to cause crosslinking of the first and second photosensitive chromophores at select portions of the amorphous film to form a waveguide.

4. A method of forming a NLO optical channel comprising the steps of:
a) forming a solution of (i) a guest nonlinear optical molecule containing a first photosensitive chromophore, (ii) a host polymer containing a second photosensitive chromophore capable of crosslinking with the first photosensitive chromophore and (iii) at least one organic solvent;
b) casting the solution formed in (a) thereby forming an amorphous film;
c) drying the amorphous film formed in (b);
d) exposing the amorphous film to an electric field for poling; and
e) exposing the amorphous film to a laser beam pattern passing through a photomask defining the NLO optical channel and having a wavelength appropriate to cause crosslinking of the first and second photosensitive chromophores at select portions of the amorphous film to form an optical channel.

* * * * *